US011198128B2

(12) United States Patent
Gökçe et al.

(10) Patent No.: US 11,198,128 B2
(45) Date of Patent: Dec. 14, 2021

(54) MICROFLUIDIC DEVICE WITH ARRAY OF CHAMBERS FOR ENCODING DETECTABLE INFORMATION

(71) Applicant: International Business Machines Corporation, Armonk, NY (US)

(72) Inventors: Onur Gökçe, Zurich (CH); Cristina G. M. Mercandetti, Hünenberg (CH); Emmanuel Delamarche, Thalwil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 404 days.

(21) Appl. No.: 16/122,396

(22) Filed: Sep. 5, 2018

(65) Prior Publication Data

US 2020/0070170 A1 Mar. 5, 2020

(51) Int. Cl.
*B81B 7/04* (2006.01)
*B01L 3/00* (2006.01)

(52) U.S. Cl.
CPC ... *B01L 3/502776* (2013.01); *B01L 3/502715* (2013.01); *B01L 3/502746* (2013.01); *B01L 3/502761* (2013.01); *B01L 2300/0816* (2013.01); *B01L 2300/0867* (2013.01); *B01L 2300/0877* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,867,757 | B2 | 1/2011 | Karlsen et al. | |
| 9,040,463 | B2 | 5/2015 | Demierre et al. | |
| 9,557,295 | B2 | 1/2017 | Kayyem | |
| 2007/0014695 | A1* | 1/2007 | Yue | B01L 3/502707 422/400 |
| 2008/0076190 | A1* | 3/2008 | Carlisle | B01L 3/5023 436/536 |
| 2011/0180425 | A1 | 7/2011 | Kayyem | |

(Continued)

OTHER PUBLICATIONS

Hitzbleck et al., "Controlled release of reagents in capillary-driven microfluidics using reagent integrators," Lab on a Chip 11.16, 2011, pp. 2680-2685.

(Continued)

*Primary Examiner* — Paul S Hyun
(74) *Attorney, Agent, or Firm* — Cantor Colburn LLP; Daniel Morris

(57) ABSTRACT

Embodiments of the invention are directed to a microfluidic device. The device comprises a flow path structure that includes an inlet microchannel and chambers. The flow path structure is configured as an arborescence extending from the inlet microchannel to the chambers. Thus, liquid introduced in said inlet microchannel can potentially enter the chambers via respective flow paths to remain essentially confined in the chambers, in operation. The device further comprises substances in selected ones of the chambers. That is, a subset of the chambers is loaded with substances adapted for interacting with liquid to yield a detectable change in a property of the liquid and/or the substance in each of the chambers of said subset, in operation. The invention is further directed to related devices, and methods of operation and conditioning.

8 Claims, 10 Drawing Sheets

(56) References Cited

U.S. PATENT DOCUMENTS

| | | | | |
|---|---|---|---|---|
| 2015/0238952 | A1* | 8/2015 | Vulto | B01L 3/00 422/500 |
| 2017/0010259 | A1 | 1/2017 | Amoabediny et al. | |
| 2017/0350821 | A1 | 12/2017 | Delamarche et al. | |
| 2020/0353462 | A1* | 11/2020 | Zhang | B01F 3/08 |

OTHER PUBLICATIONS

Wang et al., "Microfluidic DNA microarray analysis: A review," Analytica Chimica Acta 687.1, 2011, pp. 12-27.

World Health Organization, "The Use of Visceral Leishmaniasis Rapid Diagnostic Tests," http://www.who.int/tdr/publications/documents/vl-rdts.pdf (retrieved Aug. 10, 2018), 2008, 28 pages.

* cited by examiner

MICROFLUIDIC DEVICE WITH ARRAY OF CHAMBERS FOR ENCODING DETECTABLE INFORMATION

BACKGROUND

The invention relates in general to the field of microfluidic devices and, in particular to microfluidic devices having security features integrated in a liquid flow path of the device, as well as method of operating and conditioning such devices.

Microfluidics deals with the precise control and manipulation of small volumes of fluids that are typically constrained to micrometer-length scale channels and to volumes typically in the sub-milliliter range. Prominent features of microfluidics originate from the peculiar behavior that liquids exhibit at the micrometer length scale. Flow of liquids in microfluidics is typically laminar. Volumes well below one nanoliter can be reached by fabricating structures with lateral dimensions in the micrometer range. Microfluidic devices generally refer to microfabricated devices, which are used for pumping, sampling, mixing, analyzing and dosing liquids.

Many microfluidic devices have user chip interfaces and closed flow paths. Closed flow paths facilitate the integration of functional elements (e.g., heaters, mixers, pumps, UV detector, valves, etc.) into one device while minimizing problems related to leaks and evaporation. The analysis of liquid samples often requires a series of steps (e.g., filtration, dissolution of reagents, heating, washing, reading of signal, etc.). Metallic electrodes are sometimes patterned in channels of the device.

Microfluidics has opened the door for applications in many areas of healthcare and life sciences, such as point-of-care diagnostics (POCDs), environmental analysis, and drug discovery. POCDs strongly benefit from microfluidic technologies due to the miniaturization of tests, which enhances portability and the integration of various functions into one diagnostic device. For instance, many lateral flow assay tests rely on microfluidic functions and microfabrication to increase their precision and multiplexing capabilities.

POCDs are easy to use, low cost to manufacture, portable and fast, and therefore are considered an essential technology for combatting infectious diseases and improving health, e.g., in countries where such diseases are endemic. Now, there has been numerous reports and alerts on such tests being counterfeited or inappropriately sold. Amongst many examples, counterfeited tests have been sold for leishmaniasis, pregnancy tests have been sold as HIV tests, other tests have been sold for faking pregnancy, fake tests have been sold for glucose monitoring, etc.

Unrelated to microfluidics, poor adherence to prescribed medications is the cause of one of today's most pressing public health issues. Amongst other problems associated with medication non-adherence, people tend to stop taking their medication once the symptoms disappear. Consequences are not limited to mere increases in overall healthcare spending. Rather, medication non-adherence results in pathogens developing resistance to drugs, which is also the main reason why some diseases (e.g. tuberculosis) cannot be eradicated. To check for adherence to treatment, it is often useful to track metabolites or tracers from medication in urine and/or saliva.

SUMMARY

According to a first aspect, the present invention is embodied as a microfluidic device. The device basically comprises a flow path structure that includes an inlet microchannel and chambers. The flow path structure is configured as an arborescence extending from the inlet microchannel to the chambers. Thus, liquid introduced in said inlet microchannel can potentially enter the chambers via respective flow paths to remain essentially confined in the chambers, in operation. The device further comprises substances in selected ones of the chambers. That is, a subset of the chambers is loaded with substances adapted for interacting with liquid to yield a detectable change in a property of the liquid and/or the substance in each of the chambers of said subset, in operation.

The above device can advantageously be used for security applications and/or for medication adherence purposes. For security applications, the chambers may be used to encode bits of information. For medication adherence applications, a specific sign (code or message) may be decoded, in order to confirm whether a drug was taken (and at the right dose), for example. Of particular interest is that the present devices do not systematically require the loaded substances to be immobilized in the chambers, thanks to the flow path structure, which allows liquid to enter the chambers and then remain confined therein. As a result, the present approach is compatible with many chemical systems In embodiments, the flow path structure further comprises a set of m distribution microchannels, m≥2, each branching from the inlet microchannel, and m vent microchannels. The chambers are arranged in m sets of chambers, respectively associated to the m distribution microchannels. That is, each of the chambers of a same one of the m sets of chambers branches from a same distribution microchannel, so as to allow liquid in said same distribution microchannel to potentially enter said each of the chambers. Moreover, the m vent microchannels are respectively associated to the m sets of chambers, whereby each of the chambers of a same one of the m sets of chambers branches into a respective one of the m vent microchannels via a stop valve (e.g., a capillary stop valve. The latter is designed so as to prevent liquid having entered said each of the chambers to enter said respective one of the m vent microchannels.

Such an arrangement allows a compact network of distribution and vent channels, which can suitably distribute liquid along respective flow paths, for it to remain confined in the chambers, while the vent channels allow air pushed along these flow paths to be adequately evacuated.

An average diameter of the chambers shall for instance be between 50 μm and 500 μm or can be between 100 μm and 200 μm, while the average width of the channels is typically between 1 μm and 200 μm (and is normally less than the average diameter of the chambers).

In embodiments of the invention, the inlet microchannel, the m distribution microchannels, the chambers, the m vent microchannels and corresponding stop valves are all patterned on a same side of a layer of the device, so as to have a same depth, whereby the flow path structure exhibits a constant depth throughout the arborescence. This, in turn, makes it possible to process the flow path structure in a single lithographic process step (e.g., using a one-mask approach).

Each of said respective flow paths can exhibit a continuous wetting surface, whereby liquid introduced in said inlet microchannel can potentially be pulled along said wetting surface, by capillarity, so as to reach any of the chambers. Capillary-driven flows simplify the conception and fabrication of the device.

In embodiments, said stop valve comprises two or more liquid pinning structures, to make sure that no liquid passes into a vent.

At least some of the chambers can branch, each, from a distribution microchannel via a respective unidirectional valve, the latter designed so as to prevent liquid to flow back from a corresponding chamber into said distribution microchannel.

In embodiments, the chambers branch from respective distribution microchannels via respective liquid switches, each designed so as to prevent liquid to flow therethrough, both from a corresponding chamber into a respective distribution microchannel and from said respective distribution microchannel into the corresponding chamber. At least some of the liquid switches comprise a wetting agent, thanks to which the switches can be commuted. Such switches allow to "program" the liquid paths, e.g., according to a desired liquid flow path, through the flow path structure.

In embodiments of the invention, the device is designed so as to conceal to a user which of the chambers are subject to a detectable change in said property, prior to introducing liquid in said inlet microchannel. For example, parts of the flow path structure may be masked.

In embodiments, said substances are adapted for interacting with liquid to yield a detectable change in one or more of the following property of the liquid and/or the substance in the chambers of said subset: optical contrast, color, luminescence, fluorescence, pH, electrical property, phase and state.

The device can further include a layer having a surface on which the chambers are arranged according to a two-dimensional array, and wherein the flow path structure further comprises detectable alignment features, which are arranged so as to alter a symmetry of said array.

In embodiments of the invention, said detectable alignment features are enabled by a subgroup of said subset of the chambers. For example, alignment features may be enabled by substances loaded in selected chambers from this subset or by altering such chambers in a detectable way.

According to another aspect, the invention is embodied as a method of operating a microfluidic device, as described in any of the embodiments above. I.e., this method relies on a microfluidic device having a flow path structure including an inlet microchannel and chambers, wherein the flow path structure is configured as an arborescence extending from the inlet microchannel to the chambers. Thus, liquid introduced in said inlet microchannel can potentially enter the chambers via respective flow paths to remain essentially confined in the chambers, a subset of which is loaded with substances. The device is operated as follows. First, liquid is introduced in said inlet microchannel for it to enter the chambers via the respective flow paths. As it enters the chambers, liquid interacts with said substances to yield a detectable change in a property of the liquid and/or the substance in each of the chambers of said subset. Next, changes in the properties of the liquid and/or substances in the chambers are detected and a pattern as formed thanks to the detected changes is read.

In embodiments, the pattern read is a pattern formed by the loaded chambers, in which said changes are detected. In variants, the pattern read can be the pattern formed by remaining ones of the chambers (where no change occurs). In other variants, both the pattern formed by the loaded chambers and the pattern formed by remaining chambers can be read.

The method further can further include instructing computerized means to automatically compare data corresponding to the pattern read with reference data.

In embodiments of the invention, the pattern read encodes a security pattern and the method further comprises authenticating, based on an outcome of the compared data, one or each of: the microfluidic device; and an outcome of a microfluidic test performed with the device.

Reading the pattern formed thanks to (or because of) the detected changes can include identifying a first pattern subsection and a second pattern subsection; and interpreting data encoded in the first subsection according to signals obtained from the second subsection.

In embodiments, the second subsection encodes attributes for decoding the data encoded in the first subsection. In that case, the encoded data can be decoded thanks to attributes encoded in the second subsection.

Interpreting the encoded data can further include calibrating signals obtained from any pattern subsection, to take into account various or changing conditions, in which a microfluidic text or assay is performed.

In embodiments of the invention, the method further comprises reporting information derived from the pattern read to a third-party, e.g., which monitors outcomes of tests performed with said microfluidic device and other similar devices.

According to a final aspect, the invention is embodied as a method of conditioning a microfluidic device. This method again relies on a microfluidic device such as described in any of the embodiments above. First, a subset of the chambers are selected according to a predefined pattern. Then, chambers corresponding to the selected subset are loaded with substances adapted for interacting with liquid to yield a detectable change in a property of the liquid and/or the substance in each of the chambers of said subset, in operation.

In embodiments, said subset of the chambers is a first subset and said predefined pattern is a first predefined pattern, which is associated to information encoding data. Said encoding data can be decoded thanks to attributes, to which a second predefined pattern is associated. Then, the method further comprises selecting a second subset of the chambers according to the second predefined pattern, and loading chambers of the second subset selected with substances adapted for interacting with liquid to yield a detectable change in a property of the liquid and/or the substance in each of the chambers of said second subset, in operation.

If necessary, after having loaded the chambers with substances, the loaded substances are immobilized in their respective chambers.

In embodiments of the invention, the chambers are connected via respective liquid switches along respective flow paths. As evoked earlier, each of the liquid switches is designed so as to prevent liquid to flow through the switch, in any direction (from or to a corresponding chamber). In that case, a wetting agent need be loaded in at least some of the liquid switches.

The microfluidic device can include a first layer of material processed so as to form said inlet microchannel and chambers as open cavities in this layer. In this case, a second layer of material may be applied (after having loaded the chambers) onto said first layer of material to close the cavities.

Devices, systems and methods embodying the present invention will now be described, by way of non-limiting examples, and in reference to the accompanying drawings.

BRIEF DESCRIPTION OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

Figure 1:
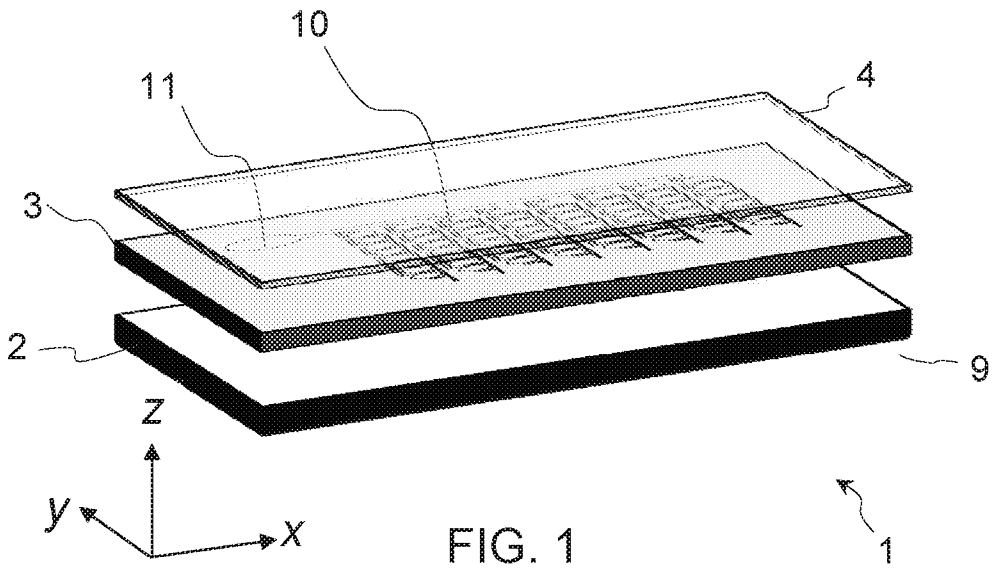
FIG. 1 is a three-dimensional (3D) view of a microfluidic device, according to embodiments of the invention.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

In reference to FIGS. 1-14, an aspect of the invention is first described, which concerns a microfluidic device 1, 1*a*.

This device 1, 1*a* comprises a flow path structure 10-10*d*. Examples of possible flow path structures are depicted in FIGS. 3-14. In each case, this structure notably includes an inlet microchannel 12, 12*a*, as well as chambers 15, 15*a* (or cells). As for instance seen in FIG. 3, the flow path structure 10 is configured as an arborescence, which extends from the inlet microchannel 12 to the chambers 15.

Figure 3:
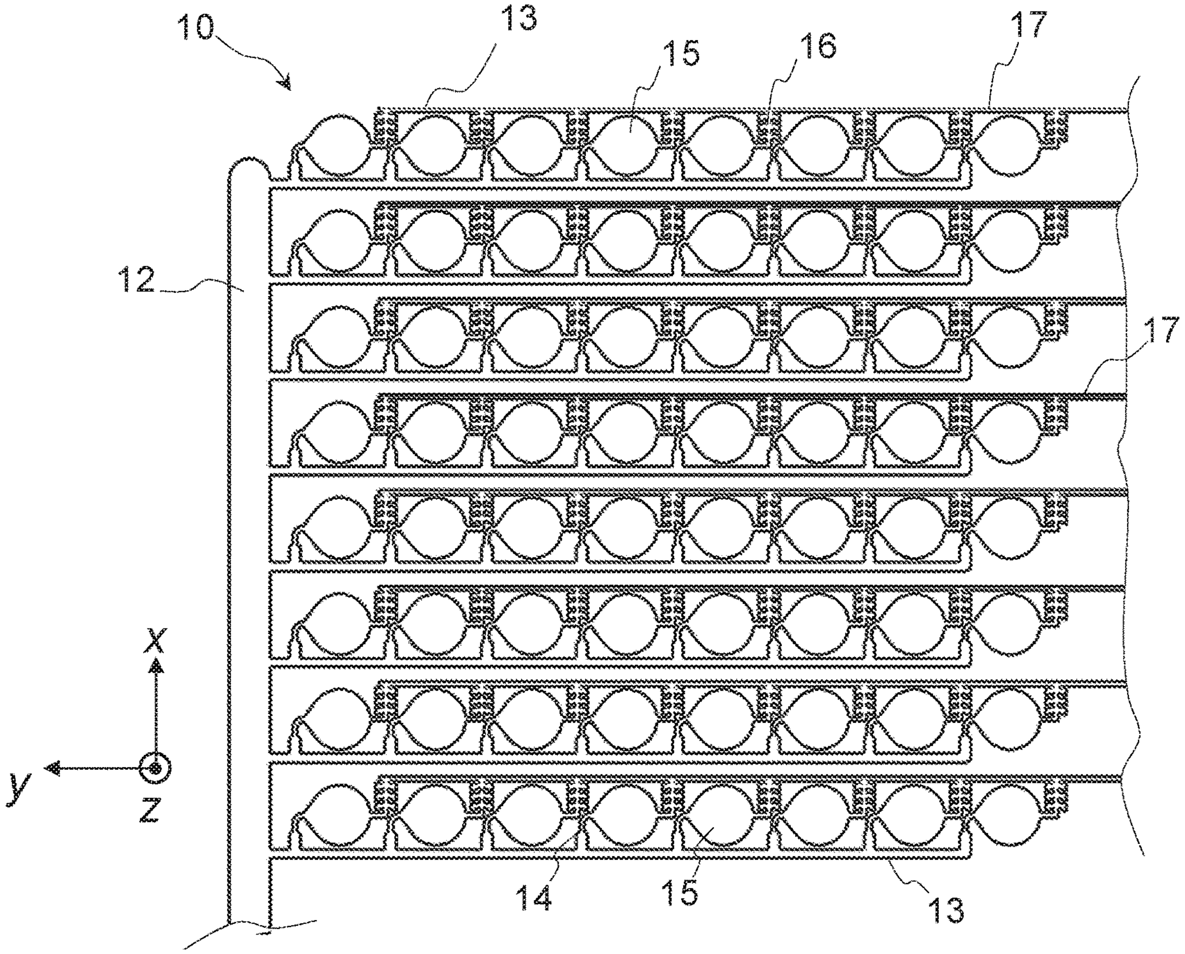
FIG. 3 illustrates a top view of possible flow path structures of a microfluidic device, as well as how chambers of these structures can be loaded with substances to yield detectable changes in such chambers, as involved in embodiments of the invention.

This arborescence can be regarded as a rooted tree, extending from the inlet channel 12 up to the chambers 15. As seen in FIG. 3, the inlet microchannel 12 and the chambers 15 can indeed be respectively regarded as a root and terminal leaves of the tree formed by the structures 12-15 distributed along the arborescence. Thanks to this arborescence, liquid introduced in the inlet microchannel 12 can potentially enter the chambers 15 and, this, via respective flow paths formed by the structures 12-15. Several types of arborescences can be contemplated, as illustrated throughout FIGS. 3-14, which in all cases makes it possible to distribute liquid from a main inlet into the (possibly numerous) chambers.

In addition, this arborescence is designed in such a manner that liquid that has entered chambers 15 will remain essentially confined in such chambers. In that sense, the chambers can be regarded as leaves of the arborescence. E.g., liquid may actively or passively enter the chambers, in order to essentially remain stuck in such chambers, at least for a sufficiently long time to enable subsequent detection operations, as discussed later.

The same principle applies to each of the flow path structures depicted in FIGS. 3-14. Now, the chambers 15, 15*a* can be arranged according to an array of chambers, e.g., a regular 2D array having constant steps in both x and y directions. That is, the chambers may possibly be arranged in a matrix array of m×n chambers, where m and n are, each, larger than or equal to 2, and can be between 4 and 16, though, in principle, larger rows and columns can be contemplated. For instance, an array of 8×8 chambers can be relied on, as in most of the designs shown in the accompanying drawings, subject to FIG. 7, where the structure involves two arrays of 4×8 chambers. Opting for regular 2D arrays eases the design and fabrication process, as well as the loading of substances in the chambers.

In that respect, a subset of the chambers 15, 15*a* is loaded with substances 21-23, as illustrated in FIGS. 11-14. Such substances are adapted to interact with liquid and thereby yield a detectable change in a property of each of the chambers 15, 15*a* of said subset, in operation of the device. This property may actually relate to the liquid, the substance, or both the substance and the liquid confined in the chambers, as exemplified below.

Namely, some of the chambers 15, 15*a* are pre-loaded with substances 21-23, such as reagents (or reactants, in which case the chambers can be regarded as reaction chambers) or other substances, which locally interact (react), in some way, with the liquid that fills the chambers 15, 15*a*. This, in turn, causes a detectable change (e.g., in color, fluorescence, or electrical properties) in the chambers 15, 15*a*.

Note, the altered properties need not be the same in all of the chambers 15, 15*a*, though they may well be, for simplicity. In other words, different substances may possibly be used in distinct subgroups of the chambers 15, 15*a* to yield distinct (albeit detectable) changes. In other words, different types of substances can be used and loaded in distinct subsets of the chambers. In some embodiments of the invention, some of the chambers may be altered, physically, so as to provide detectable properties that differ from the detectable properties enabled by the substances loaded in other, selected ones of the chambers. This, however, complicates the design and fabrication of the flow path structure 10-10*d*. Thus, if distinct detectable changes are needed, different types of substances can be loaded in distinct subsets of the chambers. Still, it is nevertheless simpler to rely on only one type of substance. In all cases, only a subset of the chambers are loaded with a same type of substance, meaning that the remaining chambers may possibly be empty (not loaded with any substance), or partly loaded with a different type of substance, or different types of substances, or still be altered.

Flow path structures 10-10*d* as depicted in FIGS. 3-14 do not make it possible for the liquid to go farther than the chambers 15, 15*a* along the respective flow paths 12-15, subject to very small channel portions downstream of the chambers, as discussed later. Thus, such flow path structures 10-10*d* can be described as allowing a liquid introduced in an inlet channel to fill the chambers and then essentially remain confined there, even after having interacted with substances 21-23 in the chambers 15, 15*a*. And this is precisely what makes it possible to obtain sustainable, detectable changes.

As a result, the present devices can advantageously be used for security applications and/or for medication adherence purposes. For security applications, chambers 15, 15*a* may be used to encode bits of information, e.g., for authentication purposes. Such encoded data can notably be used to fight counterfeiting of microfluidic devices, as for example used in point-of-care diagnostic (POCD) applications. For medication adherence applications, a specific sign (code or message) may be encoded. Note, medication adherence applications can be regarded as a specific form of security applications since in both cases, encoded data is revealed, in operation of the device, in order to be detected (e.g., using optical detection means) and interpreted, for some sort of verification. For example, for medical adherence applications, a code can be interpreted to confirm whether a drug, or drugs, were taken (possibly at a right dose). This code can then possibly be reported to a third-party, if necessary (e.g., to provide feedback to and advise a patient and/or make a decision as to a reimbursement of a treatment).

In all cases, the encoded data (code, message) is revealed upon the liquid interacting with the substance loaded in a subset of the chambers. Now, some of the available chambers may be used to encode attributes (needed for decoding the pattern read), or for calibration purposes (e.g., to enable a quality control), as latter discussed in reference to FIGS. 9 and 10.

Of particular interest in that the present devices do not systematically require the substances 21-23 to be immobilized in the chambers (though they may well be). This approach differs from devices involving substances (e.g., reagents) arranged on a liquid flow path, where such substances necessarily need to be immobilized in order not to be flushed away by the liquid flow. In the present case, the flow path structures allow liquid to enter and remain confined in the terminal chambers 15, 15*a*. Thus, liquid that reach the chambers and interact with the substances (in selected chambers) remains essentially confined in such chambers, such that the changes occurring due to this interaction are sustainable. I.e., such changes remain detectable for a sufficiently long time to ease to detection. As a result, the present devices need not necessarily to immobilize the loaded substances and are, in turn, compatible with many chemical systems.

Such devices 1, 1*a* may otherwise comprise additional microfluidic structures (e.g., microchannels, chambers, capillary pumps, electrodes, etc.) suitable to perform a microfluidic test or assay. These additional structures may possibly be fully independent from the flow path structures 10-10*d*. In embodiments of the invention, however, some of the flow path features (e.g., access channels 12, 12*a*, 13 or both the access channels and chambers 15, 15*a*) are exploited to perform the microfluidic test or assay. For example, reactants to a metabolite of a given drug may be deposited in some of the chambers 15, 15*a*. This way, it is for instance possible to produce detectable changes, which may be exploited to confirm whether a drug was duly taken by a user.

Interestingly enough, all features of the present flow path structures 10-10*d* (e.g., inlet and access channels, chambers, and other structures) may have a same depth and, thus, be fabricated using a one mask/one-step process. In addition, such flow path structures are compatible with many materials, e.g., silicon, ceramics, polymers, this including dry film resists and classical photoresists.

Figure 2:
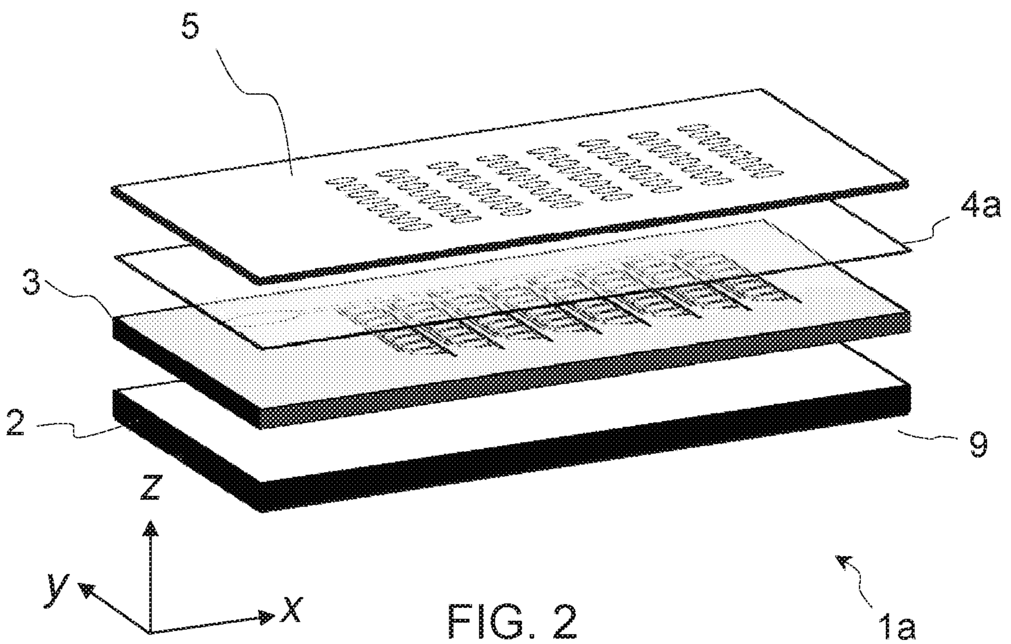
FIG. 2 is a 3D view of another microfluidic device, wherein parts of the flow path structure are concealed, according to embodiments of the invention.

In the present context, microchannels (also referred to as "channels") are typically formed as a groove on a main surface of a layer 3 of the device (see FIGS. 1 and 2). This layer 3 is for example a substrate, or any layer that is sufficiently thick to provide mechanical stability to the device, although mechanical stability may be provided by means of an additional, underlying layer 2. In all cases, layer 3 may typically be an essentially planar object, such as a chip, a wafer or any such planar support. The layer 3 may include various structures formed thereon or therein, in particular microstructures and other microfluidic features, such as capillary pumps, loading pads, anti-wetting structures, flow resistors, vents, as well as electric circuits and contact pads.

A characteristic depth of the cavities formed by channels 12, 12*a*, 13, chambers 15, 15*a*, vents 17 and other structures 14, 16, 40 can be in the micrometer-length range, i.e., between 1 μm and 200 μm (and can be between 20 μm and 200 μm). Yet, some particular structures of the present devices 1, 1*a* may be in the nanoscale range or in the millimeter range, the devices as a whole typically being in the centimeter range. Widths (e.g., as measured in-plane) for the channels 12, 12*a*, 13 and vents 17 will typically be in the micrometer-length range too (i.e., between 1 μm and 200 μm).

Meanwhile, the average diameter of the chambers 15, 15*a* can be between 50 μm and 500 μm and can be between 100 μm and 200 μm. In an in-plane design, the diameter of a chamber 15, 15*a* is measured in the plane containing the various directions of propagation of the liquid (e.g., in-plane with the upper surface of layer 3, on which channels are grooved), while a channel width is measured in-plane and perpendicularly to the direction of propagation of liquid in that channel. Normally, this width will be substantially smaller than the average diameter of the chambers.

Figure 7:
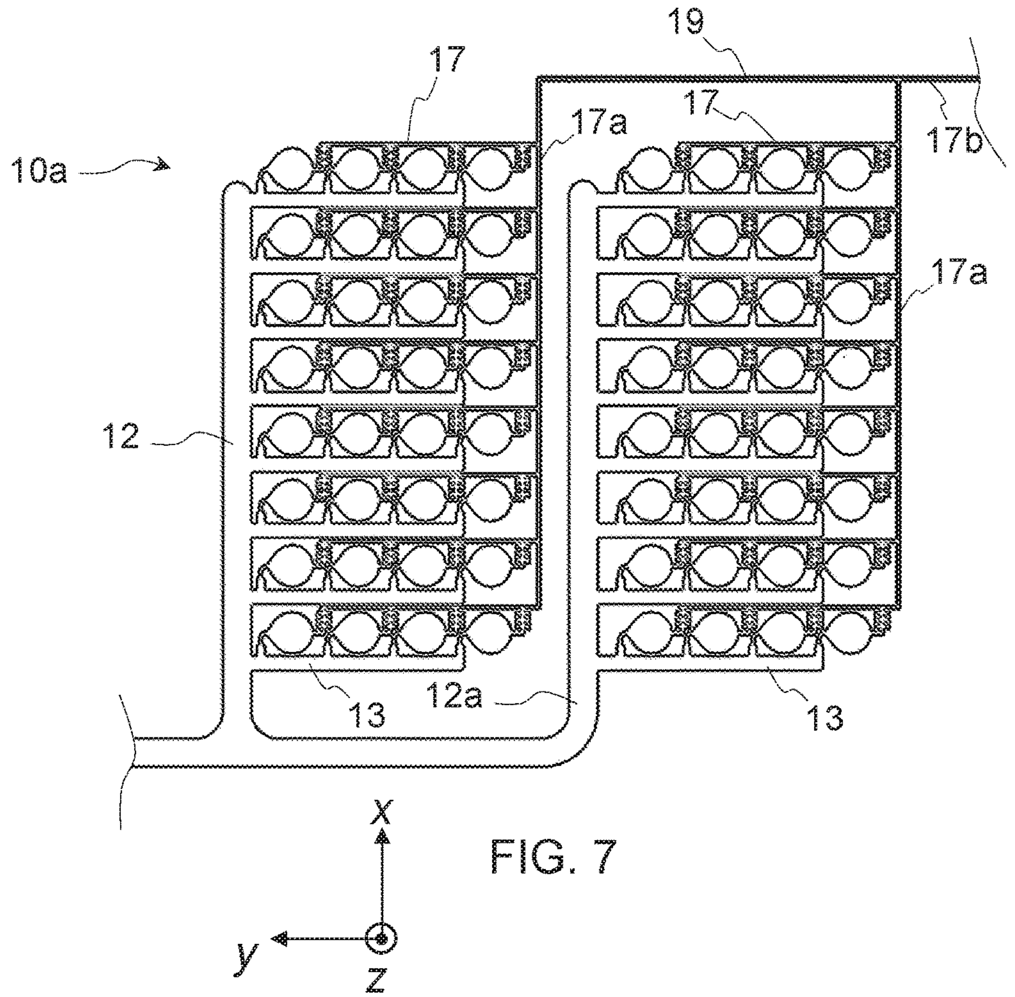
FIG. 7 illustrates a top view of possible flow path structures of a microfluidic device, as well as how chambers of these structures can be loaded with substances to yield detectable changes in such chambers, as involved in embodiments of the invention.
Figure 8:
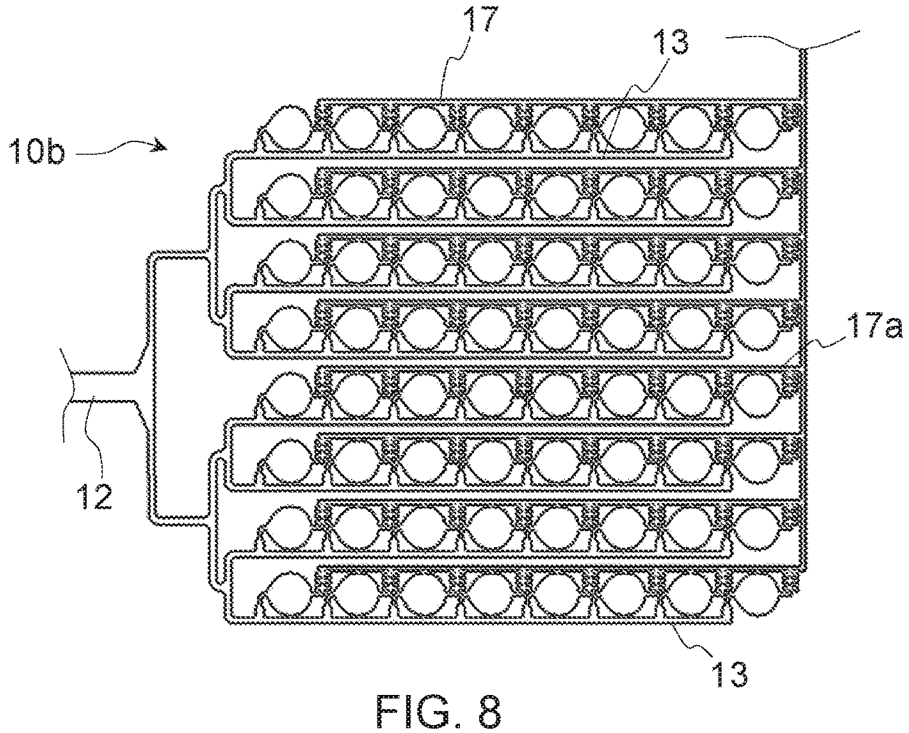
FIG. 8 illustrates a top view of possible flow path structures of a microfluidic device, as well as how chambers of these structures can be loaded with substances to yield detectable changes in such chambers, as involved in embodiments of the invention.
Figure 9:
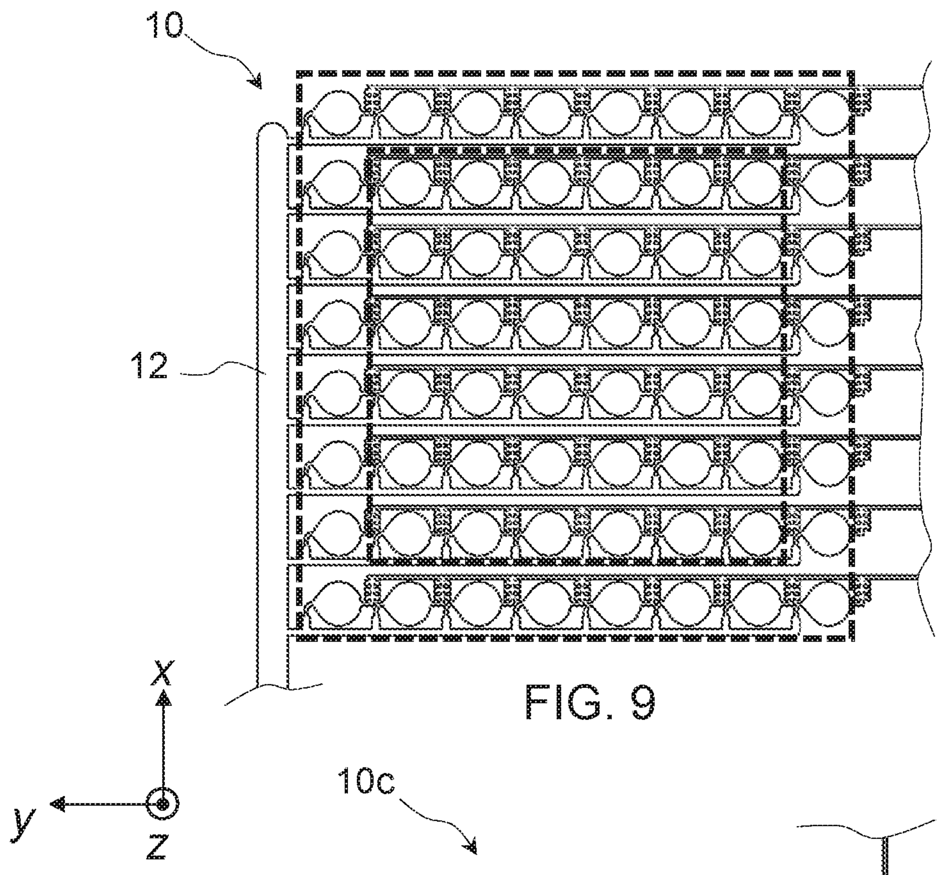
FIG. 9 illustrates a top view of possible flow path structures of a microfluidic device, as well as how chambers of these structures can be loaded with substances to yield detectable changes in such chambers, as involved in embodiments of the invention.
Figure 10:
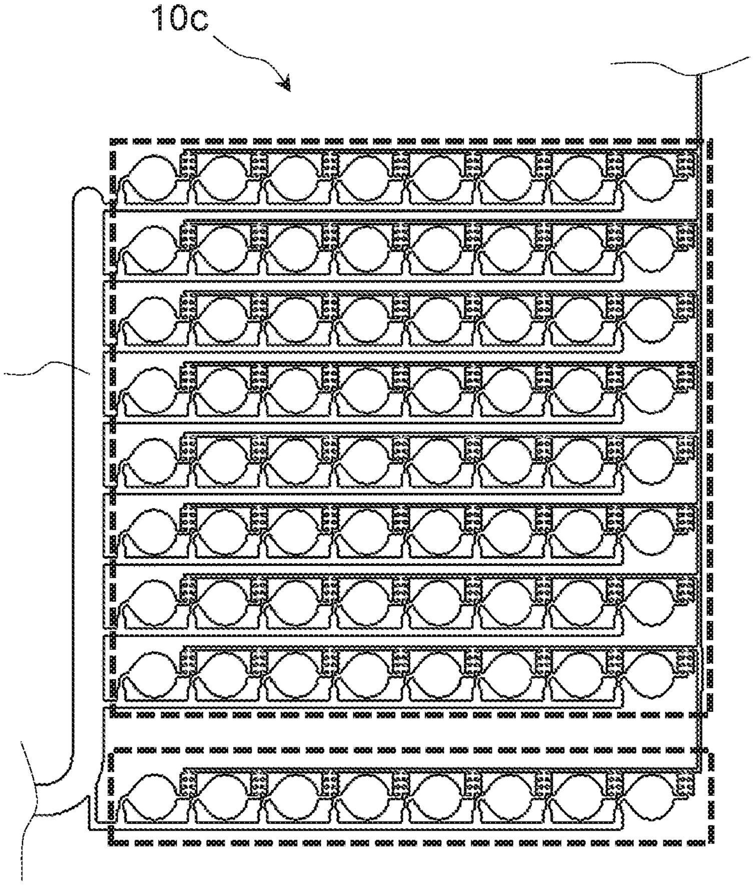
FIG. 10 illustrates a top view of possible flow path structures of a microfluidic device, as well as how chambers of these structures can be loaded with substances to yield detectable changes in such chambers, as involved in embodiments of the invention.

In embodiments of the invention, the present flow path structures further comprise a network of distribution channels 13 and vents 17, arranged so as to suitably distribute liquid and evacuate the air pushed along the flow paths 12-15. Examples of such networks are depicted in FIGS. 3, 7 and 8, which involve arrays of 4×8 or 8×8 chambers, as well as corresponding numbers (i.e., height) of distribution channels 13 and vents 17.

More generally, the flow path structure may include a set of m≥2 distribution channels 13, wherein each channel 13 branches from the inlet channel 12, 12*a*. Note, such channels 13 may branch directly from the inlet channel 12 (as in FIG. 3), or not, as illustrated in FIG. 7 (where two sets of channels 13 branch from inlets 12, 12*a*, the second inlet 12*a* branching from the first one 12) or FIG. 8 (where a splitting tree distributes liquid from a single inlet 12 to splitting channels 13).

In all cases, the chambers 15 can be correspondingly arranged in m sets of chambers 15. I.e., the m sets of chambers are respectively associated to the m distribution channels 13, whereby each chamber 15 of a same set of chambers branches from a same distribution channel 13. This way, liquid introduced in a given distribution channel 13 can potentially reach any chamber of the associated set of chambers.

In addition, the flow path structure may include m vents 17, which are arranged above respective chamber sets in the accompanying drawings. More generally, the m vents 17 are respectively associated to the m sets of chambers 15, such that each chamber 15 of a same set branches into a same, respective vent 17 via a stop valve 16. This valve is designed so as to prevent liquid having entered a chamber 15 to enter the connected vent 17.

The above structural arrangement makes it possible for liquid to potentially enter any chamber 15 via the channels 13 (e.g., passively). Meanwhile, liquid cannot go beyond the chambers 15 along respective paths 12-15, owing to the valves 16 between the chambers 15 and the vents 17. After having entered the chambers, liquid will at most fill very small channel portions bridging the chambers 15 to the valves 16. Yet, the relative dimensions of such channel portions (with respect to the chamber dimensions) do not impact the detectable property changes. Also, after liquid has filled such tiny channel portions, liquid that already fills the chamber remains confined therein. Thus, the present flow path structures 10-10*d* allow liquid to fill the chambers and essentially remain confined in the chambers 15, 15*a*, which can therefore be regarded as (terminal) leaves of the arborescence.

Note, while the vents 17 are initially distinct (there are m distinct vent portions associated to the m sets of chambers), they can merge at some point, in order to reduce the number of terminal apertures needed to evacuate air from the vents. This is illustrated in FIGS. 7 and 8, where several vents 17 merge into a single vent 17*a*. If necessary, several vents 17*a* may, in turn, merge into another vent portion 17*b* (see FIG. 7), and so on, such that a single terminal aperture may eventually be needed.

The inlet channel 12, 12*a*, the m distribution channels 13, the chambers 15, 15*a*, the m vents 17 and corresponding valves 16 can all be patterned on a same side of a layer 3 of the device 1, 1*a* (see FIGS. 1, 2), so as to have a same depth. That is, the flow path structure 10-10*d* exhibits a constant depth throughout the arborescence. This, in turn, makes it possible to process the flow path structure 10-10*d* in a single lithographic process step (e.g., using a one-mask approach).

In embodiments of the invention, each of the flow paths forming the structure 10-10*d* exhibits a continuous wetting surface. Thus, liquid introduced in an inlet channel 12, 12*a* can potentially be pulled along the wetting surface, by capillarity, so as to reach any of the chambers 15, 15*a*. The wetting flow paths can be formed by lower walls of the various channels 12, 12*a*, 13 and chambers 15, 15*a*. This, however, need not necessarily be the case: the wetting paths may notably be formed laterally (i.e., out of the plane of the chip), and/or on a sealing layer (i.e., on top), for example. Capillary-driven flows simplify the conception and fabrication of the devices 1, 1*a*. However, in more sophisticated variants, e.g., involving active pumping, liquid can be actively driven.

Figure 4:
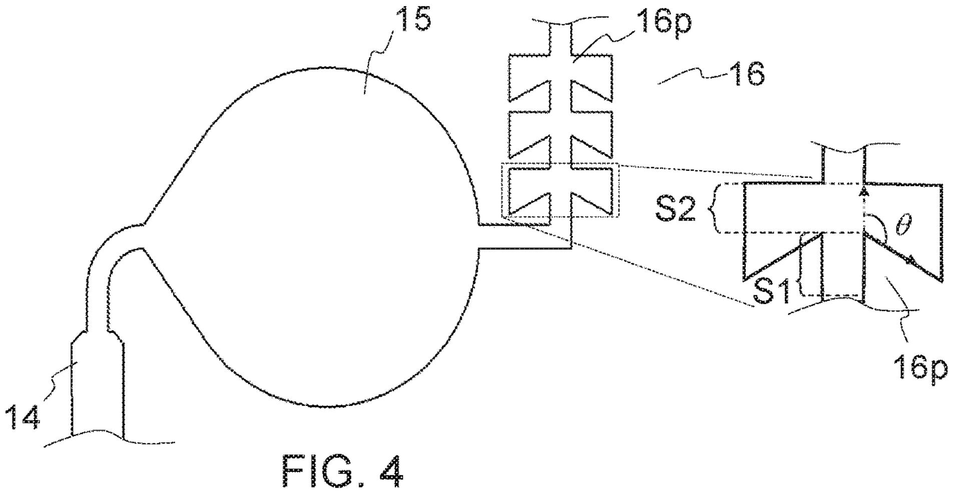
FIG. 4 illustrates a top view of possible flow path structures of a microfluidic device, as well as how chambers of these structures can be loaded with substances to yield detectable changes in such chambers, as involved in embodiments of the invention.
Figure 5:
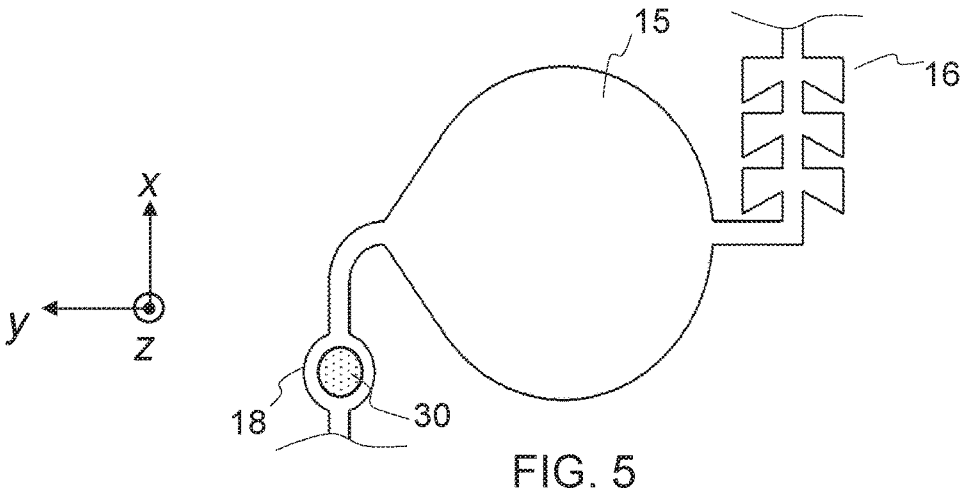
FIG. 5 illustrates a top view of possible flow path structures of a microfluidic device, as well as how chambers of these structures can be loaded with substances to yield detectable changes in such chambers, as involved in embodiments of the invention.
Figure 6:
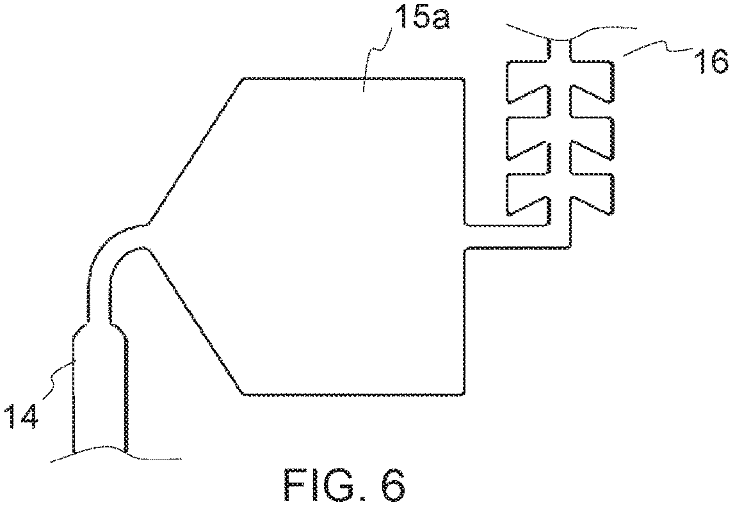
FIG. 6 illustrates a top view of possible flow path structures of a microfluidic device, as well as how chambers of these structures can be loaded with substances to yield detectable changes in such chambers, as involved in embodiments of the invention.

The stop valves 16 can be designed as a capillary stop valve, be it to ease the fabrication process. Stop valves 16 may for instance comprise, each, one or more liquid pinning structures 16*p* such as depicted in FIGS. 4-6. A pinning structure 16*p* exhibits lateral walls that flares in-plane, though the walls themselves extend out-of-plane with respect to the plane in which liquid flows. The flared lateral walls form pinning edges. A pinning structure 16*p* can be formed by differently shaped sections S1, S2, in a channel portion, as depicted in the inset of FIG. 4. For example, a first section S1 is straight and leads to a second section S2, which has a larger average diameter than the first section, so as to provide an opening angle θ at the ingress of the second section. This angle may for instance be between 60° and 160°. The opening angle θ is measured between a main longitudinal axis of the channel portion (here parallel to axis x) about the valve and one or more (lateral) walls of the second section S2, to which the section S1 leads. Thus, a liquid flow coming from the first section S1 is pinned at the ingress of the second section S2. In the examples of FIGS. 4-6, the valves 16 are in fact designed as unidirectional valves. I.e., in principle, a liquid coming from the opposite direction could pass the pinning feature in this example. However, the vent 17 is normally only filled with air in the present case, owing to the architecture and design of the liquid flow structure. In variants, the valves 16 could be designed so as to block liquid in both directions. Designing the valves 16 as unidirectional valves, however, makes it possible to relax constraints on the opposite opening angles (in the direction along −x) and thus save some space on the devices 1, 1*a*. This is all the more advantageous if a same valve 16 comprises several successive liquid pinning structures 16*p*, as in FIGS. 4-6, to make sure no liquid passes into a vent 17. More generally, though, valves 16 are stop valves, which can possibly be made unidirectional.

Note that, although straight edges are ideally used to embody the opening angles, such edges can also be rounded and thus have a radius of curvature, which can be between 10 μm and 100 μm. This may notably be useful to facilitate mold replication of such structures in polymers. The ideal curvature depends on the drill bit. For injection molding, a minimal radius of curvature is typically 40 μm.

Similarly, unidirectional valves 14 may be used upstream of the chambers. I.e., at least some of the chambers 15 may branch, each, from a distribution channel 13 via a respective unidirectional valve 14. The latter is designed so as to prevent liquid that has reached a chamber 15 to flow back into a distribution channel 13. This is useful to prevent a spill of a liquid (e.g., soluble) substances towards the inlet during the deposition of the substances 21-23. Again, such valves 14 may include a liquid pinning structure, e.g., forming an opening angle, as the valves 16, though the valves 14 are oppositely oriented (compared to valves 16) with respect to the liquid flow direction. The valves 14 can be regarded as a fluid flow constriction in the example of FIGS. 4 and 6. Thus, liquid flow coming from the channel 13 can pass the constriction 14 to reach the chamber 15, whereas liquid coming from the chamber 15 gets pinned at the ingress of the enlarged section of the valve 14. Again, such valves 14, 17 can be patterned at a same depth as the other structures 12-13, 15, and 16. That is, the liquid pinning structures of the valves 14 can flare in-plane, so as to be able to maintain a constant depth throughout the flow path structure.

Similarly, ingresses of the chambers 15 can be flared in-plane, with a sufficiently small opening angle to allow liquid to enter the chamber. Still, the wetting surface area of the chambers 15, 15*a* makes it normally favorable for liquid to advance therein, such that flared liquid inlets are optional in the chambers. More generally, various designs can be contemplated for the lateral walls of the chambers 15, 15*a*, as exemplified in FIGS. 5, 6.

While the liquid pinning structures involved in the valves 14, 17 can be flared in-plane, they may, in variants, be achieved using a vertical step (up or down, orthogonal to the flow path) of a few micrometers, such that the flow path may be slightly recessed or elevated (along z) after the step. However, this requires two-step masks or a more advanced mold for replication.

As illustrated in FIG. 5, part or all of the chambers 15 may possibly branch from respective distribution channels 13 via respective liquid switches 18. Such switches are designed to prevent liquid to flow therethrough, in both directions. I.e., liquid coming from the neighboring chamber 15 cannot flow back into the distribution channel 13, while liquid coming from said channel 13 cannot pass into the chamber 15, without altering the switch. A switch 18 may again involve flared lateral walls, which are oppositely tapered in-plane, with a sufficiently large opening angle to pin liquid at the ingress of the switch (in both directions). This way, the switches 18 may again be patterned so as to have a same depth as the other structures of the flow path design 10-10*d*.

Now, at least some of the liquid switches 18 may comprise a wetting agent 30, thanks to which liquid may overcome the pinning barrier. I.e., a switch 18 prevents liquid to flow from both directions, unless spotted with a wetting agent 30. Thus, the structures 18 effectively act as a switch, which can be commuted thanks to a wetting agent 30. Switches 18 can advantageously be used when an empty chamber 15, 15*a* is also an allowed state of the code. Such switches are nevertheless optional. In addition, only a subset of the chambers may need be commuted thanks to such switches 18. In variants, switches may be provided, which prevent liquid flows, unless being altered in some other way (e.g., physically).

In that sense, the flow path structure only "potentially" allows liquid to enter the chambers 15, 15*a*, subject to the effective state of the switches 18, if any. If no such switch is present, then the flow path structure allows liquid introduced via the input channel 12, 12*a* to effectively enter the chambers.

The designs shown in FIGS. 3-14 evoke chambers whose inner areas are essentially structureless. Moreover, the individual flow paths 13-17 (i.e., bridging channels 13 to vents 17) shown in such figures involve, each, only one chamber 15. However, in variants, the chambers 15, 15*a* may possibly be compartmented, or two or more chambers may be connected in series (along a same flow path), e.g., to enable more complex reactions such as two-step reactions. The chambers 15 may further comprise structures, such as pillars or other microstructures to support an upper layer 4, 4*a*, 5. Furthermore, capillary wetting structures may possibly be arranged in the chambers, to ease the liquid progression therein.

The present devices 1, 1*a* may possibly be designed so as to conceal parts of the liquid flow structures. The aim is to conceal (to a user) which of the chambers 15, 15*a* are potentially subject to detectable changes, prior to introducing liquid in the inlet channel. Thus, it is not possible for a user to predict where the detectable changes are going to occur, without introducing liquid in the device 1*a*. The user can thus not predict, e.g., the reaction products and their traits, and can accordingly not fake an expected reaction pattern.

A simple way to achieve this is for the substances 21-23 to be invisible, or not visible (e.g., masked). Similarly, wetting agents 30 in the liquid switches 18 may be masked or invisible. This, however, limits the compatibility of the system. Therefore, one may instead mask the flow paths to the chambers 15, 15*a*, thanks to an appropriately structured capping layer 5, at least partly, as assumed in FIG. 2. Here, connection paths and liquid switches are masked by the capping layer 5, which nevertheless exhibits holes (or transparent areas) vis-à-vis the chambers 15, so as to enable optical detection.

Indeed, where optical detection is contemplated (as in most embodiments discussed herein), the chambers 15, 15*a* need be exposed to the user, as in FIGS. 1, 2. Now, be they masked or not, the cavities formed by the structures 12-17 shall typically be all sealed by a same layer (e.g., a polymer film) 4, 4*a*.

Now, if the detection principle does not involve optical means (or any means requiring straight access to the chambers), the whole structure 10-10*d* may be capped or otherwise concealed. This is notably the case when electrical (or electrochemical) properties of the confined elements are sensed. In that case, electrodes (not shown) may be used, which extend through the chambers 15, 15*a*. For example, one electrode (or more) may be exposed to liquid in each chamber 15, 15*a*, while a common electrode may contact liquid in, e.g., the inlet channel 12. This way, one can detect a signal corresponding to changes in electrical properties occurring in the loaded chambers. Interestingly, such electrodes can extend essentially between neighboring channels 13 and vents 17. This does not considerably impact the fabrication process as only one additional mask is required to pattern the devices in that case. Such electrodes may need to cross the vents 17 or a terminal vent 17*a*, 17*b*. This, however, is not an issue since no liquid is present in such vents. In an in-plane design, electrodes may first extend between neighboring structures 13 and 17, and then curve up or down, in the plane (x, y), so as to enter respective chambers 15, 15*a*. In variants, an additional layer is provided under layer 3 and the chambers are processed so as to exhibit an aperture at the bottom, which is sealed from below by end portions of the electrodes.

More generally, several other detection mechanisms can be contemplated, as the loaded substances 21-23 may be suited for interacting with liquid and thereby yield detectable changes in a variety of properties. These may notably include changes in: optical contrast, color, luminescence, fluorescence, pH, electrical property, phase or state of the substances and/or the liquid confined in the chambers. Optical contrast may change, e.g., due to a precipitation, a phase or state changes of the liquid and/or the substance. Various reactions or, more generally, interactions may otherwise be exploited, which may lead to a change in the color, luminescence, or fluorescence of the confined mixture. Electrochemical changes may be detected as well, such as a change in the pH of the trapped liquid, or a change in electrical properties (e.g., resistivity of the interacting elements), as evoked above. In addition, a phase or state changes of the liquid/substance may also be exploited, such as a crystallization, or depolymerization, a swelling or any other deformation of the loaded substances, etc., which may in turn impact the color, contrast, electrical properties, etc., of the confined elements. Thus, a variety of detection principle can potentially be exploited.

Optical detection is perhaps the simplest and most convenient detection principle, inasmuch as a mere smartphone, or another mobile detector, may be used to detect a pattern formed due to property changes in the chambers. To that aim, a suitably programmed application may be used, to both detect and read the patterns, in much the same way as done for matrix barcodes and other machine-readable optical labels.

Figure 11:
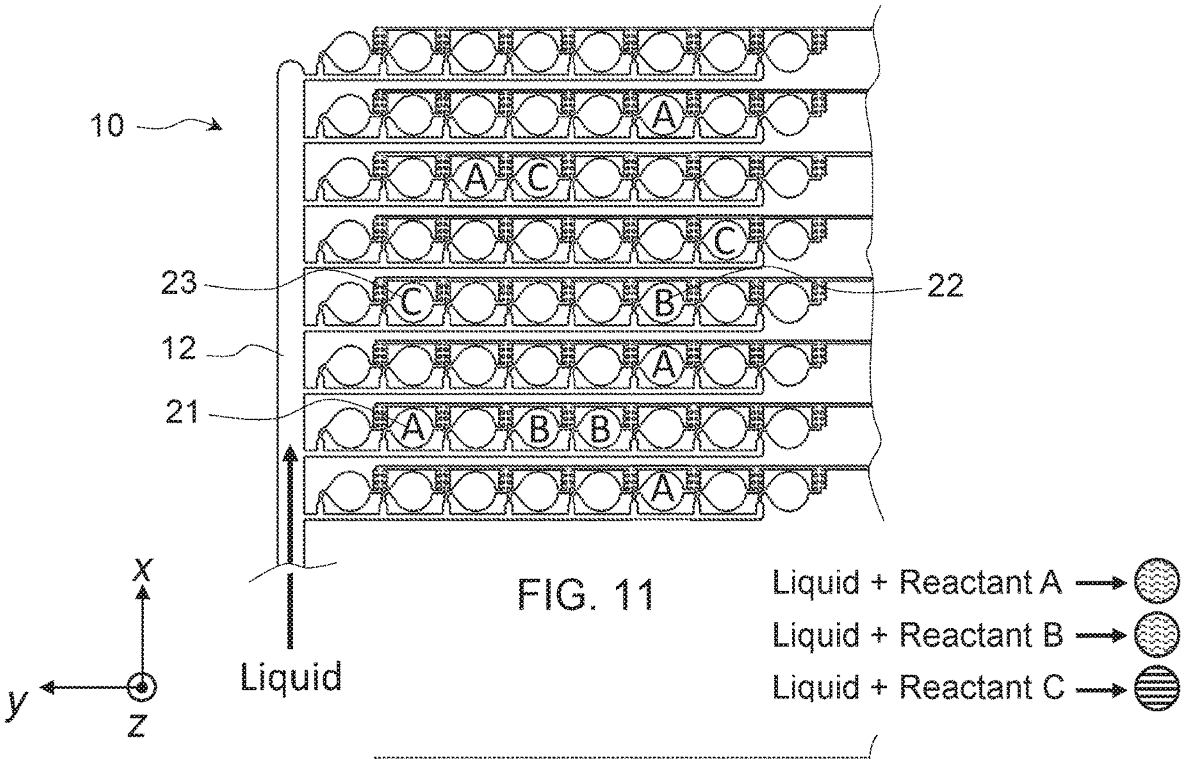
FIG. 11 illustrates a top view of possible flow path structures of a microfluidic device, as well as how chambers of these structures can be loaded with substances to yield detectable changes in such chambers, as involved in embodiments of the invention.
Figure 12:
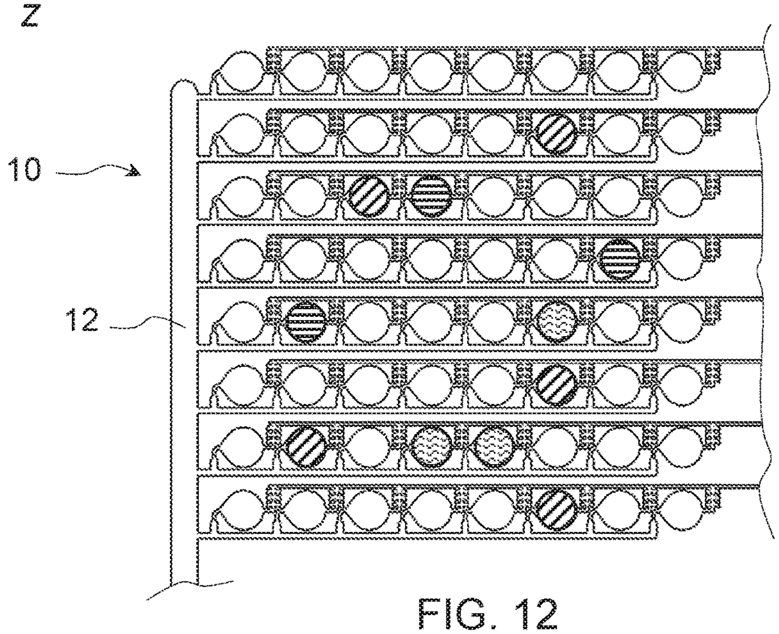
FIG. 12 illustrates a top view of possible flow path structures of a microfluidic device, as well as how chambers of these structures can be loaded with substances to yield detectable changes in such chambers, as involved in embodiments of the invention.

In addition, different color codes may be used to encode information in the chamber, as illustrated in FIGS. 11-12. Namely, liquid introduced in the inlet channel 12 will reach all the chambers, a subset of which are loaded with reactants A, B, and C (also referred to by numeral references 21-23), see FIG. 11. Yet, the same liquid may give rise, upon reacting with distinct reactants A, B, C, to different color changes, as denoted by different pattern fills in FIG. 12.

For example, the present Inventors have fabricated a microfluidic chip, whose channel depths are of ~50 μm. Acids and bases were spotted at different concentration into the reaction chambers and the microfluidic cavities 12-17 were closed by a PDMS capping layer. Channels were capillary filled with an aqueous pH responsive solution (red cabbage extract). This gave rise to different colors of the rainbow, depending on the pH of the solution in individual chambers and due to different amount of acids and bases contained in chambers.

Now, optical detection methods may likely require alignment features in the code. Such alignment features may be provided in several ways. Alignment features 40, 41 can form part of the flow path structure, so as to keep the fabrication process simple, as assumed in FIGS. 13, 14. In one example (FIG. 13), some of the chambers 15 are exploited to display alignment features 41. In another example, the alignment features 40 form integral part of the flow path structure and can even be filled with liquid, though they do not form part of the array of chambers 15.

In detail, the device 1, 1*a* may comprise a layer 3, which exhibits a surface on which the chambers 15, 15*a* are arranged according to a two-dimensional (2D) array. There, a flow path structure 10, 10*d* may involve alignment features 40, 41, which are arranged so as to alter a symmetry of this array.

Figure 14:
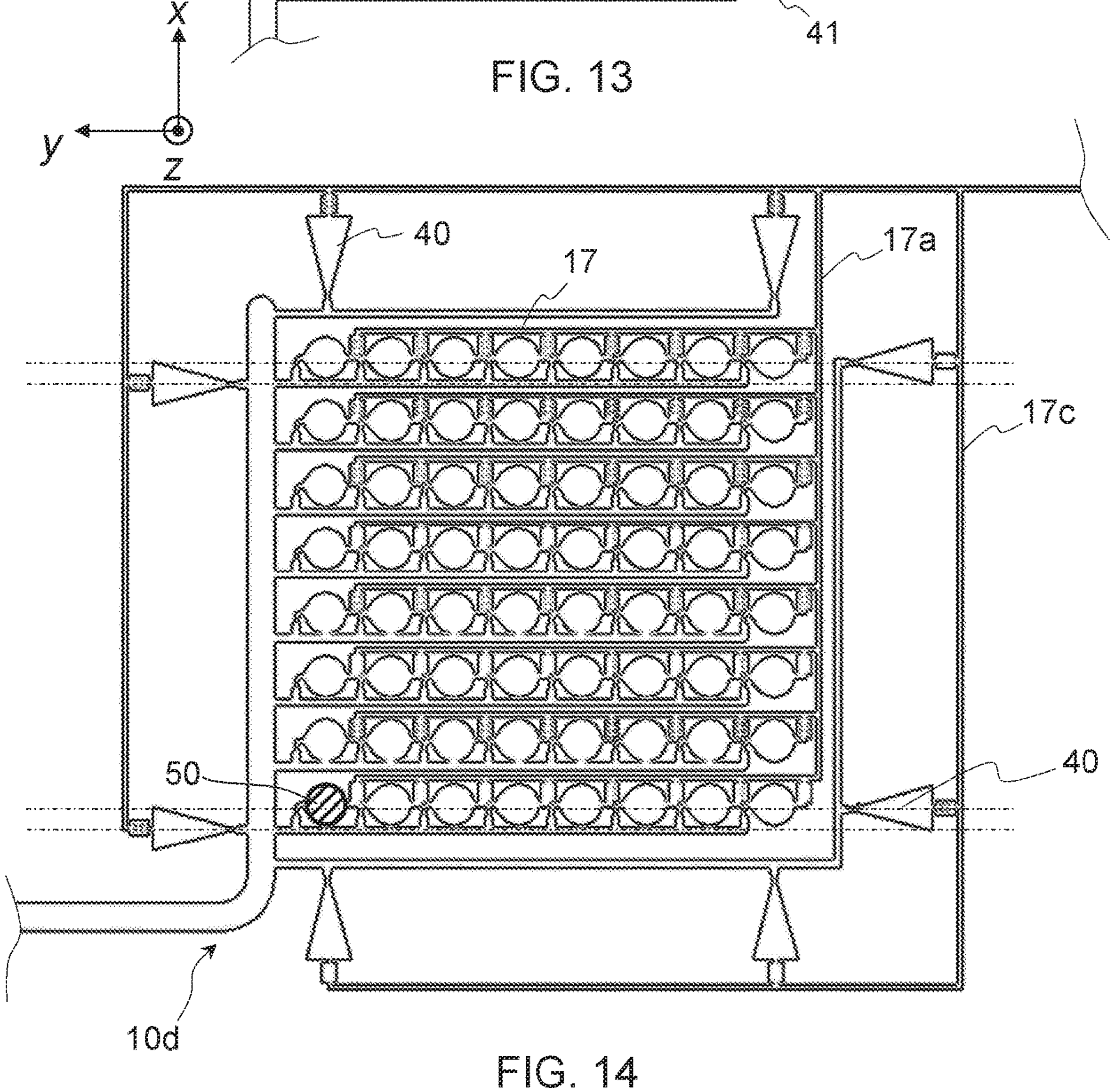
FIG. 14 illustrates a top view of possible flow path structures of a microfluidic device, as well as how chambers of these structures can be loaded with substances to yield detectable changes in such chambers, as involved in embodiments of the invention.
Figure 15:
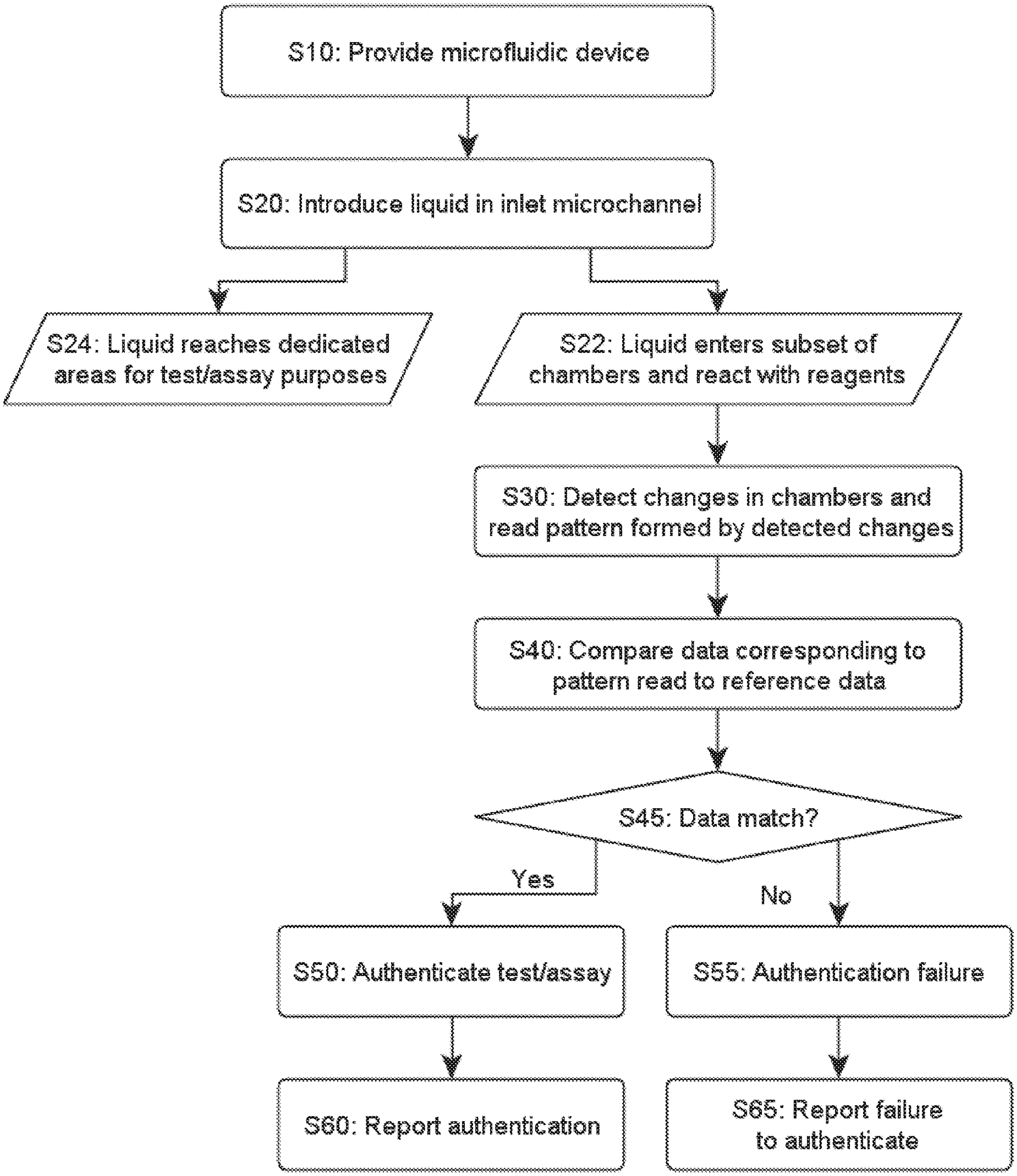
FIG. 15 is a flowchart illustrating high-level steps of a method of operating a microfluidic device, in order to read and exploit a pattern formed thanks to changes detected in chambers of the device, as in embodiments of the invention.

For example, in FIG. 14, the alignment features 40 are alignment marks 40 are placed outside of the array of chambers 15 but are asymmetrically arranged with respect to a 2D matrix of chambers 15: the LHS features 40 are not aligned, vertically (i.e., along x), with the RHS features 40. The pitch between LHS and RHS features 40 roughly corresponds to half the vertical extension of a chamber 15 in that case. Interestingly, such features 40 may be processed so as to connect to the flow path structure 10*d* and be filled by liquid, in operation, as assumed in the design shown in FIG. 14. Therefore, alignment features 40 may connect to outer vents 17*c*, merging down with vents 17*a*. Again, stop valves, unidirectional valves or other pinning structures can be used, to prevent liquid to pass into the vents, following principles described earlier. Thus, a same process may be used to fabricate the alignment structures 40 and the rest of the flow path structure 10*d*. Still, the bottom surface of such alignment features 40 may easily be colored, so as to ease their optical detection once filled with liquid.

The alignment marks may have a variety of shapes and arrangements, as long as these alter the symmetry of the 2D array. In FIG. 14, for example, the external alignment marks 40 have a specific geometry (arrowheads) that is suitable to locate and orient the array.

In variants to FIG. 14, alignment features 41 may be enabled by the array of chambers 15. Alignment features 41 may for example be provided, e.g., in the outer rim or a lower row of the chamber array, as identified in FIG. 9 or 10 by dashed squares. Such alignment features may be statically encoded or, better, be achieved using substances (e.g., reagents) loaded in the corresponding chambers, for more flexibility. That is, a subgroup of the loaded chambers may be dedicated to alignment purposes. For example, in FIG. 13, alignment features 41 are achieved by way of reagents, which, after reaction (see the circles filled with a pattern of thick horizontal lines) yield detectable changes that are not symmetric under reflection through any of the axis x or y, contrary to the 2D matrix of chambers.

Alignment features 40, 41 can be used to detect the location and orientation of the code. They may notably be used to define an origin 50 of the code. That is, a given chamber may be loaded with a substance or otherwise altered so as to define the origin 50 of the matrix code, as identified in FIG. 13 or 14 by way of a circle filled with a pattern of thick diagonal stripes.

Depending on whether they are used as encoding pixels, alignment marks or origin, the chambers 15, 15*a* could be loaded with substances that possibly lead to distinct, detectable changes (e.g., different colors). Still, as noted earlier, the chambers meant to correspond to alignment marks or the origin may else be statically altered (e.g., structurally altered or colored) to exhibit detectable properties that differs from the other encoding pixels, in operation.

Figure 13:
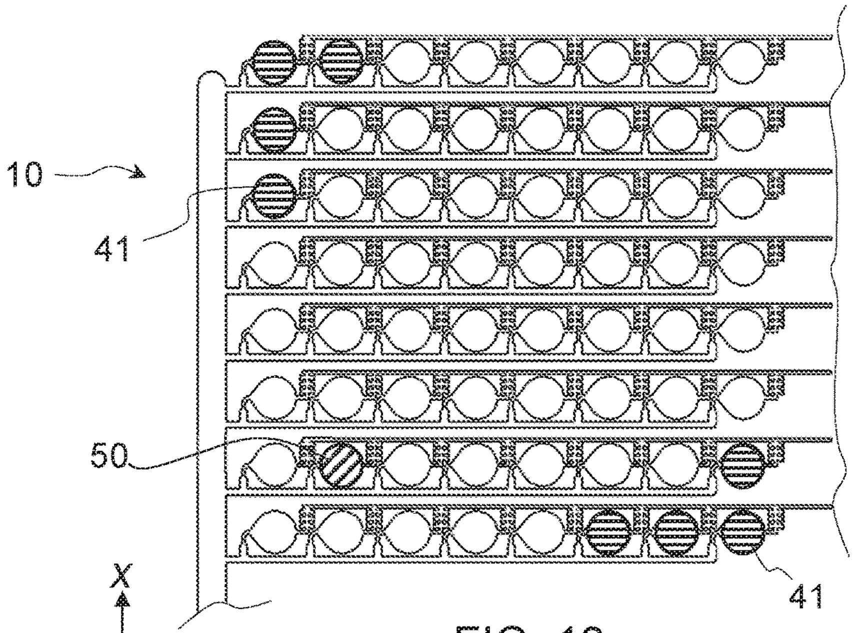
FIG. 13 illustrates a top view of possible flow path structures of a microfluidic device, as well as how chambers of these structures can be loaded with substances to yield detectable changes in such chambers, as involved in embodiments of the invention.

The variants illustrated in FIGS. 13 and 14 have pros and cons. Enabling alignment features 41 and origins 50 by way of loadable substances (e.g., reagents) allows increased flexibility compared to a solution where alignment features and origins are fixed. However, such variants consume and thus require additional chambers (all things being otherwise equal), compared to a solution involving external features 40, as in FIG. 14. Now, while the design of FIG. 14 allows the whole array to be exploited to define the code, this comes at the price of some additional processing and footprint to define the features 40.

The present Inventors have developed and tested various prototypes of devices according to embodiments described above. They have notably designed various types of flow path structures, having different types of arborescence. As they observed, hydrophobic channels may accumulate hydraulic pressure, which might result in the failure of valves 16 protecting the vents 17, for example when using a splitting tree as shown in FIG. 8. This, in turn, may possibly prevent some chambers from filling, in operation. In such cases, the reaction chamber matrix can advantageously be divided into parts, as in FIG. 7, to shorten the microfluidic channels thereby lower the hydraulic pressure build-up. There are, however, many possible ways to distribute the liquid for scalability in different materials. For instance, in embodiments, the dimensions of the channels may also be increased for compatibility with injection molding or fabrication with a SU-8 polymer.

Referring to FIGS. 11-16, another aspect of the invention is now described, which concerns methods of operating a microfluidic device 1, 1*a*, in order to detect changes in chambers of the device and read a corresponding pattern. Aspects of such methods have already been implicitly addressed above and are only briefly described in the following.

Essentially, such methods involve (step S10, FIG. 15) a microfluidic device 1, 1*a*, such as described above. I.e., this device has a flow path structure 10-10*d* configured as an arborescence leading to terminal chambers 15, 15*a*, such that liquid introduced in the inlet channel 12, 12*a* can potentially enter chambers 15, 15*a* (via respective flow paths 12-15) and remain essentially confined therein.

Thus, assuming that a subset of the chambers 15, 15*a* is loaded with suitable substances 21-23, a liquid is introduced (step S20) in the inlet channel 12, 12*a*, for it to enter the chambers 15, 15*a* via respective flow paths 12-15 and interact with said substances 21-23 and yield detectable changes in the loaded chambers.

Next, such changes are detected S30 and the pattern formed thanks to the detected changes is read S30, e.g., using a smartphone.

In principle, the message displayed may be devised so as to be intelligible (e.g., as a letter or sign) and thus suitable for interpretation by a human. However, this approach offers little flexibility, in terms of coding possibilities, is error-prone and can easily be faked. Thus, the pattern can be read S30 via a detection device rather than by a human, also to enable automatic and secure comparisons, as in applications described below.

Note, the pattern read may correspond to an appearing pattern and/or a residual pattern, where optical detection means are used. For example, the pattern effectively interpreted may correspond to the sole pattern as formed by the loaded chambers, for which changes are detected S30. In this case, the pattern read corresponds to the appearing pattern, i.e., the pattern formed by the sole chambers, whose properties have changed. In variants, only the residual pattern or both the appearing and residual patterns can be read. Reading both patterns allows for a consistency check between the two patterns.

Next, the present methods can involve computerized means to automatically compare S40 data corresponding to the pattern read with some reference data. For example, the pattern locally read with a detector or an optical reader (e.g., a smartphone) may be transmitted to a remote location (e.g., a server), for comparison purposes. In variants, the pattern read is locally compared (e.g., using the same detector/reader), via a secure application.

In applications to microfluidics' security, the pattern read encodes a security pattern. There, the comparison performed at step S40 may be exploited to authenticate S50 the microfluidic device 1, 1*a*, and/or an outcome of a microfluidic test, or assay, performed with the device. The authentication step S50 is based on an outcome of the comparison performed at step S45. Note, this authentication S50 may possibly involve other authentication factors and, thus, additional steps, which may notably require scanning a barcode or another machine-readable optical label on the device package, for example. In variants to barcodes or other optical labels, one may also use NFC/RFID tags or stickers, for example.

In addition, a quality control (not shown in FIG. 15) may possibly be performed, e.g., at step S30, as discussed later in detail. Moreover, a positive control may be requested, to make sure the test successfully worked. I.e., a positive control may be required to validate the test, which can be achieved by adding a reagent upstream or within specific chambers 15, 15*a*. If a positive control is confirmed, then the algorithm proceeds to step S45. If not, the user is invited to redo the test, using a new device. In addition, a failure may optionally be reported to a third-party.

Figure 16:
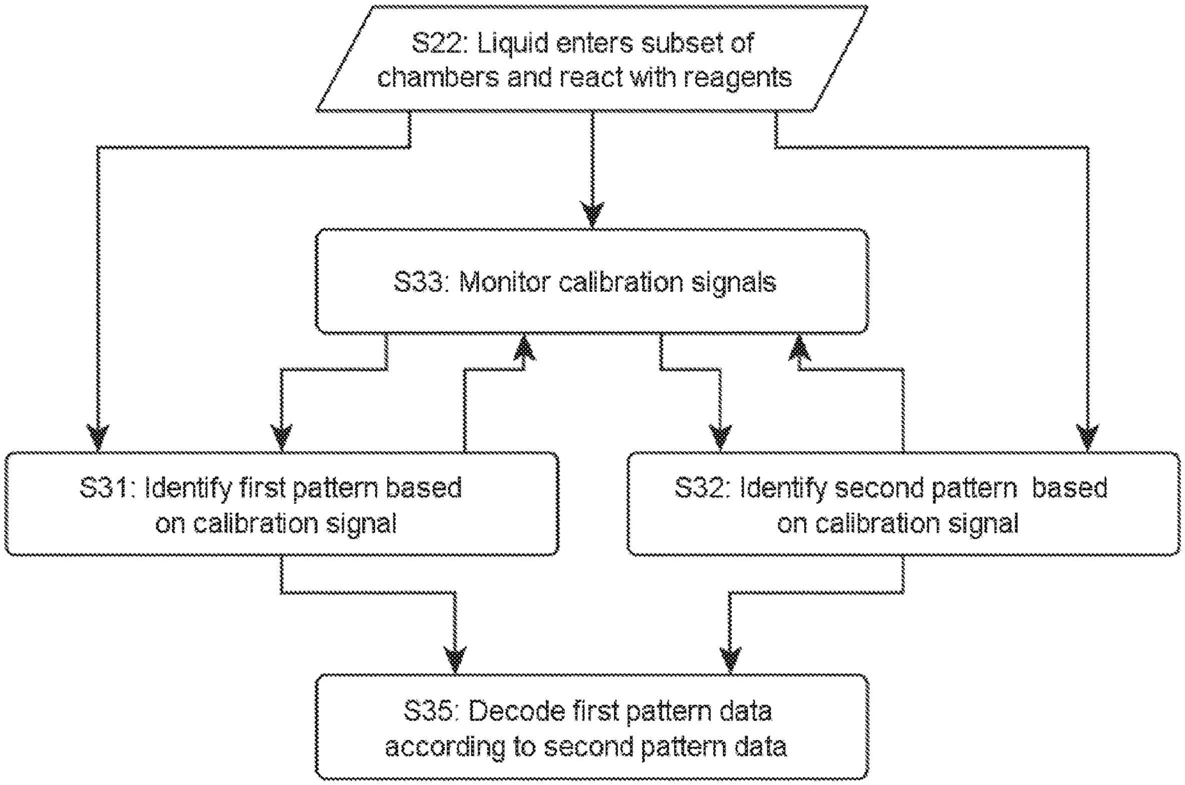
FIG. 16 is a flowchart illustrating high-level steps of a particular method of operating a microfluidic device, wherein signals obtained from a first pattern subsection are interpreted based on signals obtained from a second pattern subsection, as in embodiments of the invention.

Referring now to the flowchart of FIG. 16, step S30 may for instance decompose as follows. Instead of relying on a single pattern or two complementary patterns, the detection algorithm may attempt to identify S31, S32 distinct pattern subsections, these including, e.g., first and second pattern subsections (or more). In that case, data encoded in the first subsection may be interpreted S31, S35 according to signals obtained S32 based on the second pattern subsection. More than two pattern subsections may be needed, e.g., for purposes of calibration or positive control, as exemplified below.

For example, a first subsection may be used to encode data, while another subsection is used for decoding purposes, by way of encoded attributes. That is, the second subsection may encode attributes needed for decoding the data encoded in the first subsection. In that case, the interpretation of the encoded data requires to decode S35 the encoded data thanks to attributes encoded in the second subsection. Code attributes specify instructions to decode the data encoded in the first subsection.

For example, several types of attributes may be needed to decode an optical code, such as the origin 50 of the code (as evoked earlier in reference to FIGS. 13 and 14), the read order (e.g., row-major, column major), endianness (the sequential order in which bytes are arranged), and the radix (or base, i.e., the number of unique digits, including zero, used to represent numbers). Such information may possibly be predetermined and thus not require explicit coding. In variants, such information may be encoded, by way of attributes, e.g., enabled by substances loaded in chambers of the frame of FIG. 9 or in the lower row of FIG. 10. Meanwhile, the inner frame of FIG. 9 and the main array of FIG. 10 can be used to encode data. In addition, a value look-up table may be required to interpret the result (e.g., colors detected). Each instruction bit has a specific location and information is given through a specific appearing color.

Next, a further pattern subsection may serve for signal calibration purposes (e.g., for quality control, as evoked above). I.e., the interpretation S35 of the encoded data (whereby, e.g., signals from a first subsection are interpreted based on signals obtained from a second pattern subsection)

may further rely on a calibration S31-S33 of signals obtained S31, S32 from any pattern subsection. For example, a reference subgroup of the chambers are suitably monitored S33 to serve for signal calibration purposes and calibration signals may, in turn, be used to identify S31, S32 signals pertaining to one, two (as in FIG. 16) or more pattern subsections. Calibration may further serve to perform a quality control, e.g., as a pre-requisite to the comparison S40, S45 performed for authentication purposes, as mentioned earlier.

Note, in that respect, that environmental conditions might affect reaction kinetics, therefore a code may appear differently from what is expected. This variability can be compensated with internal reference signals, which develop simultaneously with the rest of the code. That is, such internal reference signals act as an adaptive look-up table. If necessary, reference signals may be duplicated and distributed at different locations to reduce noise and compensate for local differences (e.g. in illumination).

The data interpretation may possibly require attributes (to decode the data), in addition to a calibration. Thus, in embodiments, three subgroups of chambers may be involved, which corresponds to three pattern subsections, to be used for data encoding, attributes and signal calibration purposes, respectively. More chamber subgroups and pattern subsections can possibly be involved, in more sophisticated approaches. For instance, a given chamber subgroups may be dedicated to a microfluidic test (e.g., involving reactants to given drugs) and changes in properties of corresponding chambers may be detected and used to interpret other patterns formed by other subgroups of chambers.

Referring back to FIG. 15, outcomes of the data interpretation comparisons may possibly be reported. That is, in embodiments, the pattern read is reported S60, S65 to a third-party, which, e.g., monitors outcomes of tests performed with microfluidic devices (i.e., by several users). In one application scenario, the patterns read are reported to an authority tracking outcomes of tests performed with microfluidic devices, e.g., in order to provide medical feedback to users, for medical adherence, and/or, still, for security purposes, these notably including anti-counterfeiting applications.

Figure 17:
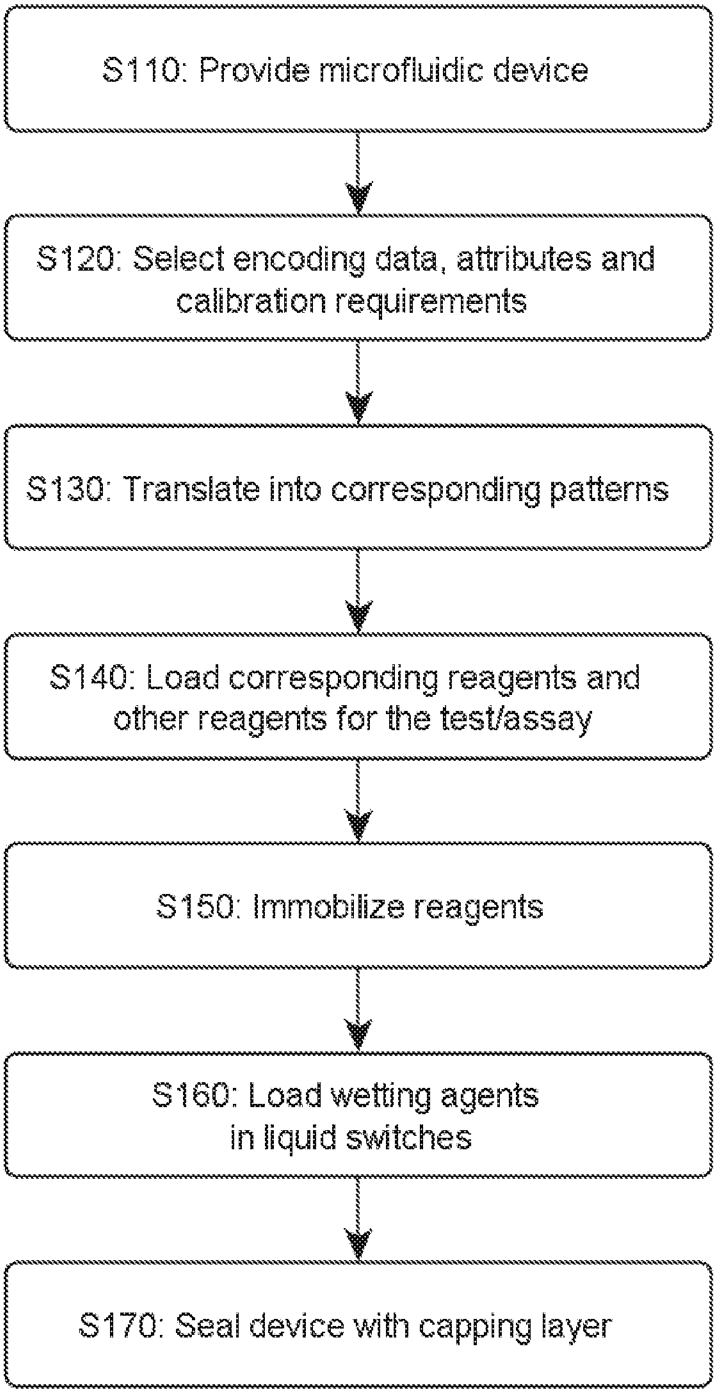
FIG. 17 is a flowchart illustrating high-level steps of a method of conditioning a microfluidic device, where chambers selected according to a predefined pattern are loaded with substances, as in embodiments of the invention.

Referring to FIG. 17, a final aspect of the invention is now described, which relates to methods of conditioning a microfluidic device 1, 1*a*. Aspects of such methods have implicitly been addressed before.

Essentially, such methods again rely S110 on a microfluidic device 1, 1*a* such as described earlier, i.e., having a flow path structure 10-10*d* configured as an arborescence extending from an inlet channel 12, 12*a* to terminal chambers 15, 15*a*, via respective flow paths. A subset of the chambers 15, 15*a* are first selected S120-130 according to a predefined S130 pattern. Then, the selected chambers 15, 15*a* are loaded S140 with substances as described earlier. I.e., these may interact with liquid to yield a detectable change in the chambers 15, 15*a*, when operating the device according to the methods discussed in reference to FIGS. 15 and 16.

As noted earlier, distinct pattern subsections may possibly be required. Therefore, distinct subsets of chambers 15, 15*a* may need be selected S120-130, according to respective, predefined S130 patterns. For example, a first predefined pattern may be associated to data for encoding information, which encoding data will need be decoded thanks to specific attributes, associated to a second predefined pattern. Consistently, two subsets of chambers may be selected at steps S120-S130 according to respectively predefined patterns. Finally, chambers corresponding to the selected subsets are loaded S140 with suitable substances, which may possibly lead to distinct property changes, in operation. I.e., the attributes may for instance be encoded by way of reagents that yield changes of liquid properties that are distinct from changes induced by data encoding cells. Similarly, chambers dedicated to calibration purposes may need be selected and loaded with corresponding reagents, if necessary. And still other chambers may be selected, to place specific reagents (to perform the actual test).

If necessary, the loaded S140 substances may be immobilized S150 in their respective chambers 15, 15*a*. This may not be necessary if properties of the substances 21-23 (e.g., surface tension, size, viscosity, etc.) and/or properties of the chambers 15, 15*a* and/or adjoining features (e.g., valves 14, 16) already make sure that the substances 21-23 will remain suitably confined in the chambers 15, 15*a*, for a sufficiently long time to enable the subsequent detection (after having reacted with the liquid).

As further noted earlier, the chambers 15, 15*a* may possibly be connected via respective liquid switches 18 along their respective flow paths 12-15. In that case, a wetting agent will be loaded S160 in at least some of the liquid switches 18. Wetting agents are normally deposited after filling the chambers with substances 21-23, to prevent the spill of liquid substances during their deposition. This, however, is not necessary when using solid or other non-flowing substances.

Finally, the microfluidic device 1, 1*a* may need be covered, or sealed. Assuming, as in FIG. 1 or 2, that a layer 3 of material is processed so as to form structures 12-17, 40 as open cavities in this layer, then a second layer 4, 4*a* of material may be applied S170 onto layer 3 to close the cavities, after having loaded the chambers 15, 15*a* with substances 21-23, as well as the switches with wetting agents, if necessary. Note, for completeness, that the fabrication of the present devices may possibly be performed at distinct locations. E.g., cavities of the device 1, 1*a* may be patterned in one location, then the device may possibly be shipped to a second location for loading specific substances, and then to a third location, in order to commute the switches, if any, and seal the device. The device as obtained before commuting the liquid switches may not effectively allow liquid introduced in an inlet channel to reach the chambers yet. In that sense, the device as obtained before its very final fabrication steps only potentially allows liquid to reach the chambers.

Examples of applications are now briefly described.

1. Medication adherence verification kit. Here, reactants to a metabolite of a drug are deposited in some of the reaction chambers. A code appears only if the metabolite from the drug is present in, e.g., urine, saliva or blood. The detected code is match to a value in a database, to check whether the drug was correctly taken. Multiple drugs can possibly be tracked (e.g., for cocktail regimens for HIV treatments). Reactants may also be deposited in concentration series to accurately measure and/or track the dosage of drug taken.

2. Avoiding panic in epidemics/pandemics. Here, a diagnostic test result can be encrypted. Reagents for the diagnostic test and controls are deposited in some of the reaction chambers. A positive or a negative result yields different codes that can only be decrypted by an authorized third-party (e.g., an authority).

3. Anti-counterfeiting. In this example, the detected code is used to authenticate a product, which may involve additional authentication factors (personal ID, barcode on the device, etc.).

4. Analytical cartography. The reaction chambers can be loaded with a diverse set of reagents to probe an unknown chemical. The set of reagents can be specific for different applications, e.g., to measure alcohol, sugar, sulfur, flavonoid content to characterize wines, etc. Potentially interfering chemicals can be detected to warn on potentially invalid tests.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly mentioned could be contemplated to fabricate parts of the devices 1, 1*a*, such as glass or metal.

What is claimed is:

1. A microfluidic device comprising:

a flow path structure including an inlet microchannel and chambers, wherein the flow path structure is configured as an arborescence extending from the inlet microchannel to the chambers such that liquid introduced in said inlet microchannel can potentially enter the chambers via respective arborescence flow paths to remain essentially confined in the chambers;

a subset of the chambers, wherein each chamber of the subset of the chambers comprises one substance of one or more substances adapted for interacting with liquid to yield a detectable change in a property of the liquid or the one substance in each of the chambers of said sub set;

a set of m distribution microchannels, m≥2, each branching from the inlet microchannel; and m vent microchannels;

wherein the inlet microchannel, the m distribution microchannels, the chambers, and the m vent microchannels are all patterned on a same side of a layer of the device, so as to have a same depth, whereby the flow path structure exhibits a constant depth throughout the arborescence;

wherein said chambers are arranged in m sets of chambers, respectively associated to the m distribution microchannels, whereby each of the chambers of a same one of the m sets of chambers branches from a same distribution microchannel, so as to allow liquid in said same distribution microchannel to potentially enter said each of the chambers;

wherein the m vent microchannels are respectively associated to the m sets of chambers such that each of the chambers of a same one of the m sets of chambers branches into a same vent microchannel of the m vent microchannels via a stop valve, the latter designed so as to prevent liquid having entered said each of the chambers to enter said respective one of the m vent microchannels; and wherein at least some of the chambers branch, each, from a distribution microchannel via a respective unidirectional valve, the latter designed so as to prevent liquid to flow back from a corresponding chamber into said distribution microchannel.

2. The microfluidic device according to claim 1, wherein:

the stop valve comprises two or more liquid pinning structures.

3. The microfluidic device according to claim 1, further comprising:

a continuous wetting surface between each of said respective arborescence flow paths and the inlet microchannel configured such that liquid introduced in said inlet microchannel can potentially be pulled along said wetting surface, by capillarity, so as to reach any of the chambers.

4. The microfluidic device according to claim 1, further comprising:

a capping layer configured to conceal the chambers.

5. The microfluidic device according to claim 1, wherein:

an average diameter of the chambers is between 50 μm and 500 μm.

6. The microfluidic device according to claim 1, wherein:

the property comprises one or more of optical contrast, color, fluorescence, pH, electrical property, phase and state.

7. The microfluidic device according to claim 1, wherein:

the device further comprises a layer having a surface on which the chambers are arranged according to a two-dimensional array; and the flow path structure further comprises detectable alignment features asymmetrically arranged with respect to the two-dimensional array.

8. A microfluidic device comprising:

a flow path structure including an inlet microchannel and chambers, wherein the flow path structure is configured as an arborescence extending from the inlet microchannel to the chambers such that liquid introduced in said inlet microchannel can potentially enter the chambers via respective arborescence flow paths to remain essentially confined in the chambers;

a subset of the chambers, wherein each chamber of the subset of the chambers comprises one substance of one or more substances adapted for interacting with liquid to yield a detectable change in a property of the liquid or the one substance in each of the chambers of said subset;

a set of m distribution microchannels, m≥2, each branching from the inlet microchannel; and m vent microchannels;

wherein the inlet microchannel, the m distribution microchannels, the chambers, and the m vent microchannels are all patterned on a same side of a layer of the device, so as to have a same depth, whereby the flow path structure exhibits a constant depth throughout the arborescence;

wherein said chambers are arranged in m sets of chambers, respectively associated to the m distribution microchannels, whereby each of the chambers of a same one of the m sets of chambers branches from a same distribution microchannel, so as to allow liquid in said same distribution microchannel to potentially enter said each of the chambers;

wherein the m vent microchannels are respectively associated to the m sets of chambers such that each of the chambers of a same one of the m sets of chambers branches into a same vent microchannel of the m vent microchannels via a stop valve, the latter designed so as to prevent liquid having entered said each of the chambers to enter said respective one of the m vent microchannels; and wherein the chambers branch from respective distribution microchannels via respective liquid switches, each designed so as to prevent liquid to flow therethrough, both from a corresponding chamber into a respective distribution microchannel and from said respective distribution microchannel into the corresponding chamber, and wherein at least some of the liquid switches comprise a wetting agent.

* * * * *